United States Patent [19]
Wu et al.

[11] Patent Number: 5,728,598
[45] Date of Patent: Mar. 17, 1998

[54] METHOD OF MANUFACTURING A SRAM CELL HAVING A LOW STAND-BY CURRENT

[75] Inventors: Hsiao-Chia Wu; Jung Kao, both of Hsinchu; Thomas Chang, Taichung, all of Taiwan

[73] Assignee: Mosel Vitelic Inc., Hsinchu, Taiwan

[21] Appl. No.: 685,815

[22] Filed: Jul. 24, 1996

[51] Int. Cl.⁶ .................................... H01L 21/8244
[52] U.S. Cl. ........................ 437/60; 437/193; 437/918
[58] Field of Search ........................ 437/60, 193, 195, 437/918; 148/DIG. 136

[56] References Cited

U.S. PATENT DOCUMENTS

| | | |
|---|---|---|
| 5,025,741 | 6/1991 | Suwanai et al. ............... 437/918 |
| 5,268,325 | 12/1993 | Spinner, III et al. ............ 437/60 |
| 5,474,948 | 12/1995 | Yamazaki ....................... 437/193 |
| 5,605,859 | 2/1997 | Lee ................................. 437/60 |

*Primary Examiner*—Chandra Chaudhari
*Attorney, Agent, or Firm*—Bacon & Thomas

[57] ABSTRACT

The present invention relates to a method of fabricating a SRAM cell that has a low stand-by current. A second polysilicon layer which is used as polysilicon resistor is exactly over a first polysilicon layer. The double polysilicon layer is utilized to reduced a stand-by current. A electric field is generated between the two layers caused by applying different voltage to the two polysilicon layer respectively, and the carriers in the second polysilicon layer will be repeled to form a depletion region, which will increase the resistance of the second polysilicon layer. Therefore, the stand-by current (Isb) will be reduced.

21 Claims, 4 Drawing Sheets

METHOD OF MANUFACTURING A SRAM CELL HAVING A LOW STAND-BY CURRENT

FIELD OF THE INVENTION

The present invention relates to a method of fabricating a SRAM cell that has a low stand-by current.

BACKGROUND OF THE INVENTION

SRAMs are referred to as static random access memories. They do not require periodic refresh signals in order to retain their stored data. As shown in FIG. 1, each of the memory cells in a SRAM generally comprises a flip-flop and two transfer MOSFET's. The flip-flop is composed of a pair of inverter circuits each comprising of a high resistance load element and drive MOSFET. The flip-flops are combined with two switching MOSFET ($T_3$, $T_4$) which are connected to the write line (WL) for exchanging information via data line ($DL_1$, $DL_2$). The flip-flop is composed of two inverter circuits, one of them comprising a high resistance $R_1$, and a drive MOSFET $T_1$, the other comprising a high resistance $R_2$ and a drive MOSFET $T_2$. The input and output terminals of one inverter circuit are respectively coupled to the output and input terminals of the other inverter circuit. One end of the resistor is connected to power supply voltage Vcc, the other end of the resistor is connected to the drain region of the corresponding drive MOSFET. The bit state in a SRAM is stored in a pair of cross-coupled inverters. The voltage on each of the two outputs of a flip-flop circuit is stable at only one of two possible voltage levels, because the operation of the circuit forces one output to a high potential, and the other to a low potential. The memory logic state of the cell is determined by whichever of the two inverter outputs is high. When the cell in the state of holding data, a so called stand-by current Isb flows through $R_1$ and a current I flows through $R_2$ for holding data. The stand-by current Isb is the smaller the better. In order to approach the purpose the high value polysilicon resistors are used as the load devices in the poly-load SRAM cell. Unfortunately, the data retention will became poor while the resistance of the resistor is too high. That is because the current I which is used to hold data is small, even smaller than a leakage current. On the contrary, if the resistance of the resistor is too small the stand-by current Isb will be large, which will waste a lot of power.

SUMMARY OF THE INVENTION

A double polysilicon layer is utilized to reduced a stand-by current. A second polysilicon layer is exactly over a first polysilicon layer. A electric field is generated between the two layers caused by applying different voltage to the two polysilicon layer respectively, and the carriers in the second polysilicon layer 2P will be repeled to form a depletion region, which will increase the resistance of the second polysilicon layer. Therefore, the stand-by current (Isb) will be reduced.

A method of manufacturing polysilicon resistor which has low stand-by current is disclosed herein. A first polysilicon layer is deposited over a substrate. The first polysilicon layer is about 2000-4000 angstroms and the first polysilicon layer is doped by N type impurities. Next, photolithography and etching step are used to form a gate structure. A dielectric layer is formed on the the first polysilicon layer and the substrate. The dielectric layer is composed of silicon dioxide or silicon nitride. The thickness of the dielectric layer is about 500-2000 angstroms. Subsequently, Utilizing photolithography and etching processes are performed to etch the dielectric layer to form a contact window. A second polysilicon layer is formed on the dielectric layer and the substrate. The second polysilicon layer is formed to have a thickness about 500-2000 angstroms. An etching process is then performed to etch the second polysilicon layer. A second dielectric layer is then deposited on the first dielectric layer and the second polysilicon layer to have a thickness about a range of between 4000-8000 angstroms. Any suitable material can be used to form the second dielectric layer such as BPSG (borophosphosilicate glass). Then a metal layer is form on the BPSG layer. Any suitable material can be used to form the metal layer such as tungsten or aluminum. Next, an etching process is utilized to etch the metal layer. A third dielectric layer is formed on the metal layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
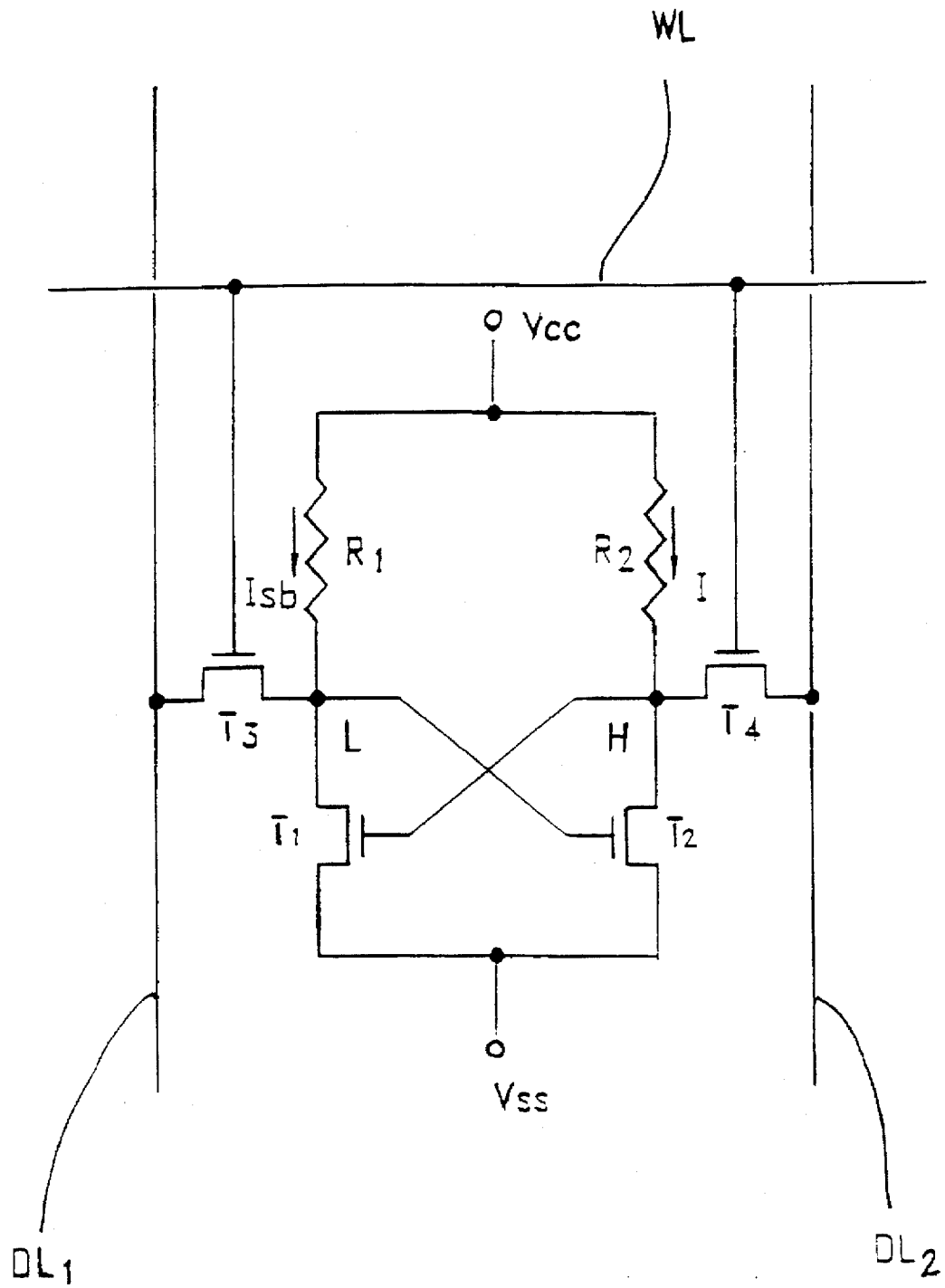
FIG. 1 is a circuit diagram of a memory cell in SRAM.
Figure 2:
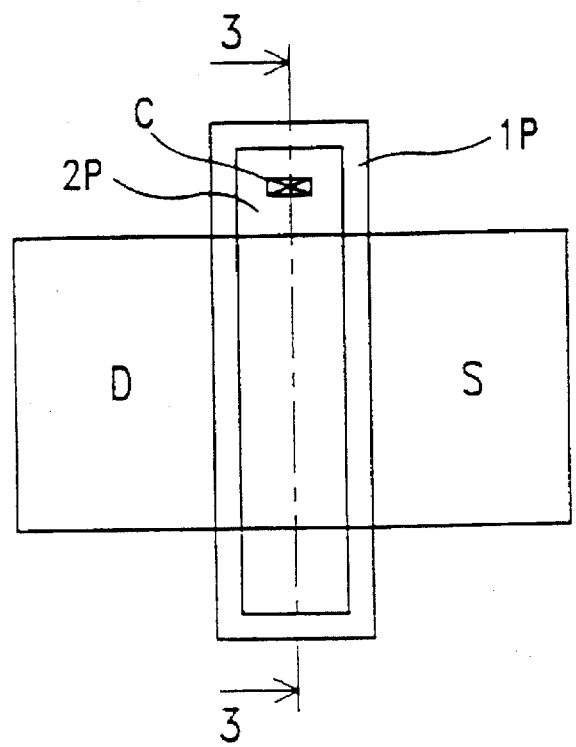
FIG. 2 is a top view of a layout structure in accordance with the invention.

FIG. 2 illustrates a top view of the present invention. The letters D, S are represent the drain and the source respectively, C is represent the contact window. 1P is denoted a first polysilicon layer which is used as the gate of MOSFET ($T_1$ or $T_2$). and 2P is denoted a second polysilicon layer which is used as a load resistor ($R_1$ or $R_2$). The feature of the present invention is that the second polysilicon layer 2P is exactly over the first polysilicon layer 1P to reduce the stand-by current. Generally speaking, in holding data state, one of the MOSFET in flip-flop circuit is applied a high voltage and the other is applied a low voltage. For example, the output of $T_2$ is applied a high voltage (H) while the output of $T_1$ is applied a low voltage (L).

Figure 3A:
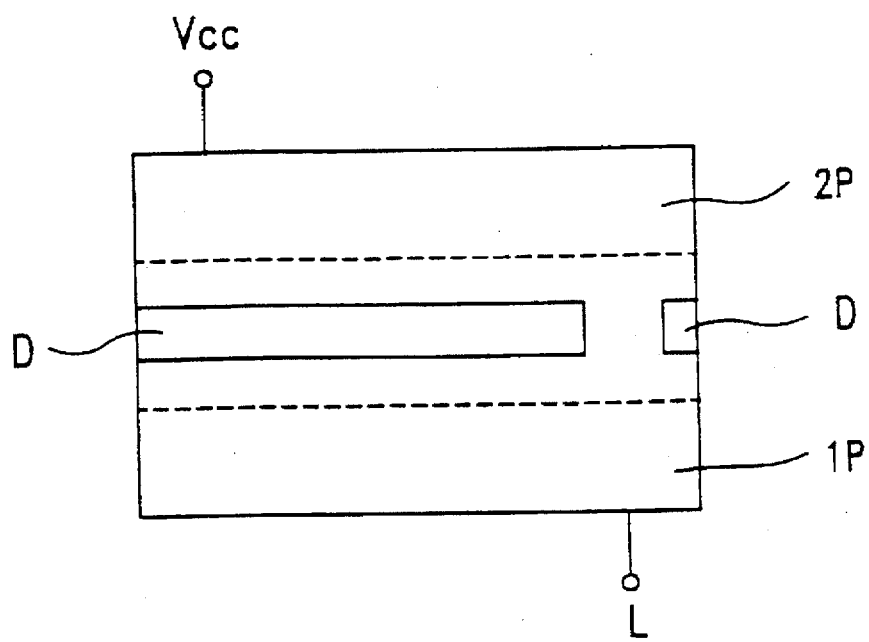
FIG. 3a is a cross section view of the first polysilicon and a second polysilicon structure in accordance with the invention.
Figure 3B:
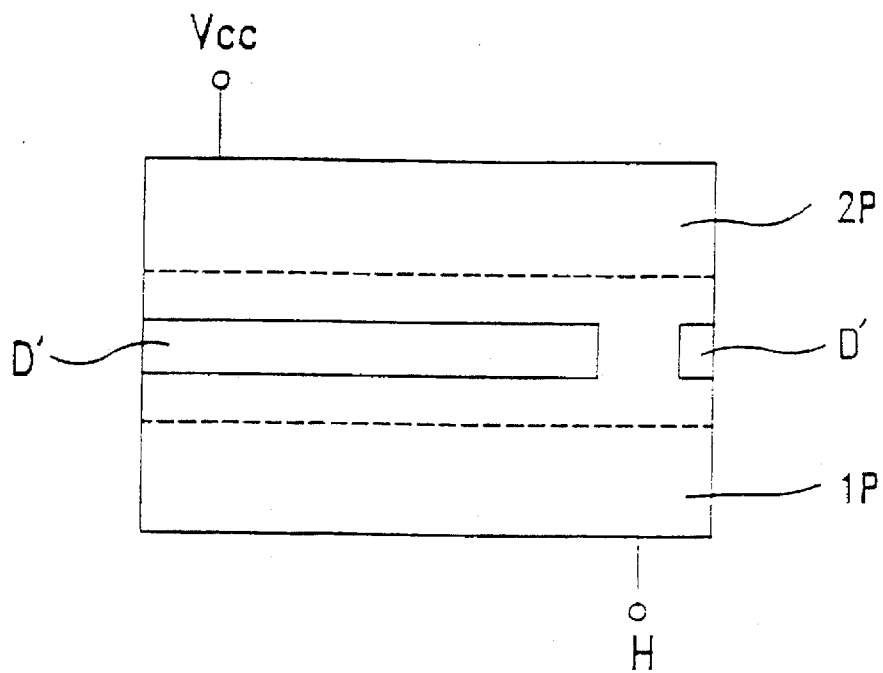
FIG. 3b is a cross section view of the first polysilicon and a second polysilicon structure in accordance with the invention.

FIG. 3a is the A—A cross section view of FIG. 2. In the state of holding data, one terminal of the $R_1$ is applied a voltage Vcc while the other terminal which is connected to the gate of $T_2$ is near ground (denoted by L). The first polysilicon 1P and the second polysilicon layer 2P are both N type. A electric field is generated between the two layers caused by the large voltage difference, and the carriers in the second polysilicon layer 2P will be repeled to form a depletion region, which will increase the resistance of the second polysilicon layer. Therefore, the stand-by current (Isb) will be reduce. On the other hand, one terminal of the $R_2$ is applied a voltage Vcc while the other terminal which is connected to $T_2$ is applied a voltage near Vcc (denoted by H ). As shown in FIG. 3b, The voltage difference between the two layers is approach to zero so that the resistance of the second polysilicon layer will not be changed, the current I which is used to hold data will keep the same and the data hold performance will not be degraded. A suitable thickness of a dielectric layer (D') in preferred embodiment is about 500–2000 angstroms.

Figure 4:
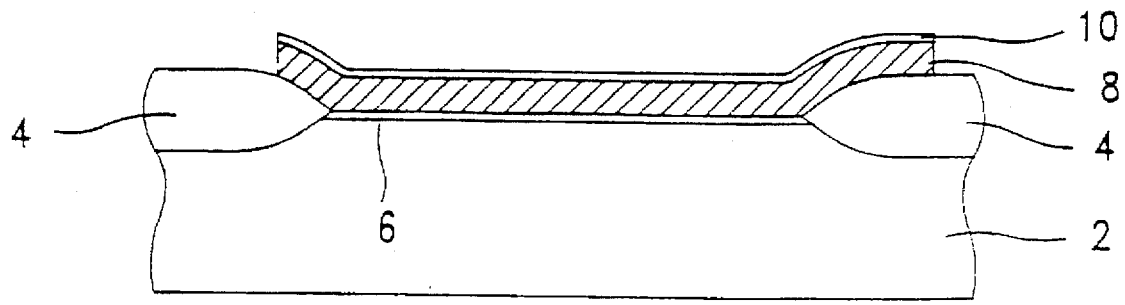
FIG. 4 is a cross section view of a semiconductor substrate illustrating the step of forming a first polysilicon gate in accordance with the invention.

A method of manufacturing a polysilicon resistor which has low stand-by current is disclosed herein. As shown in FIG. 4, a single crystal silicon substrate 2 preferably has a <100> crystallographic orientation. Thick field oxide region (FOX) 4 is created for purposes of isolation. Generally speaking, the FOX 4 region is created via photolithography and dry etching steps to etch a silicon nitride-silicon dioxide composition layer. After the photoresist is removed and wet cleaned, a thermal oxidation in an oxygen steam ambient is used to form the FOX 4 region, to a thickness about 4000–6000 angstroms. Initially, a silicon dioxide layer 6 is created atop the substrate 2 to act as the gate oxide 6. In the preferred embodiment, the silicon dioxide layer 6 is formed by using an oxygen-stem ambient, at a temperature between about 850° to 1000° C. Alternatively, the oxide may be formed using other known oxide chemical compositions and procedures. As is known in the art, by controlling the pressure and time at which the oxygen-steam ambient is exposed to the substrate, the thickness of the silicon dioxide layer 6 can be easily controlled. In the preferred embodiment, the thickness of the silicon dioxide layer 6 is approximately 100–150 angstroms.

A first polysilicon layer 8 is then deposition over the FOX regions 4 and the silicon dioxide layer 6 by using LPCVD (low pressure chemical vapor deposition) method. In the preferred thickness of the first polysilicon layer 8 is about 2000–4000 angstroms and the first polysilicon layer 8 is doped by N type impurities. A tungsten silicide (WSi$_x$) layer 10 is then deposited by using CVD process to a thickness about 1000–1500 angstroms. Next, photolithography and etching step are used to form a gate structure.

Figure 5:
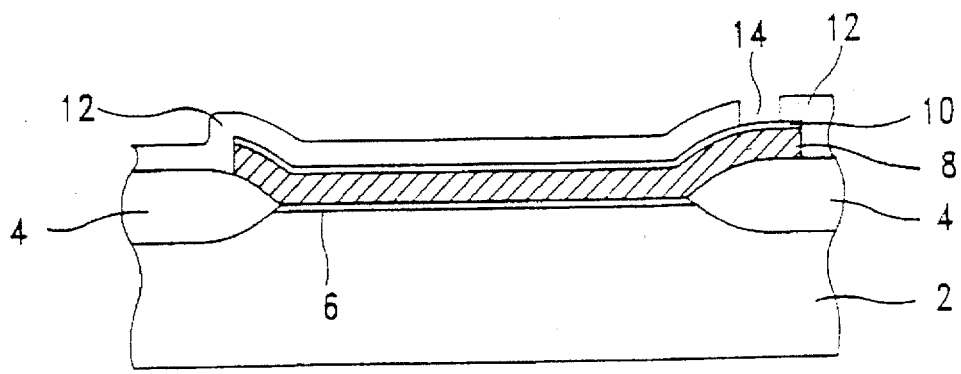
FIG. 5 is a cross section view of a semiconductor substrate illustrating the step of forming contact window in accordance with the invention.

As shown in FIG. 5, a first dielectric layer 12 is formed on the the first polysilicon layer 8, the substrate 2 and on the FOX 4. In preferred embodiment, the first dielectric layer 12 is composed of silicon dioxide or silicon nitride. The thickness of the first dielectric layer 12 is in a range about 500–2000 angstroms. Subsequently, Utilizing photolithography and etching processes are performed to etch the first dielectric layer 12 to form a contact window 4. The first polysilicon layer 8 is connected with subsequent layer via the contact window 14.

Figure 6:
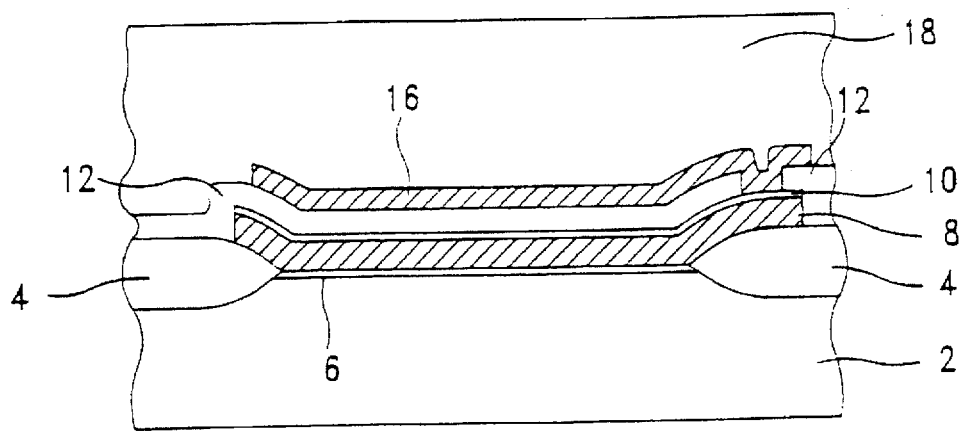
FIG. 6 is a cross section view of a semiconductor substrate illustrating the step of forming a second polysilicon layer and forming second dielectric layer in accordance with the invention.

Referring to FIG. 6, a second polysiicon layer 16 is formed on the first dielectric layer 12 and the substrate 2. The second polysilicon layer 16 is formed to have a thickness about 500–2000 angstroms. In this embodiment, the impurities of the second polysiicon layer 16 is the same with the ones of the first polysilicon layer 8. An etching process is then performed to etch the second polysilicon layer 16. A second dielectric layer 18 is then deposited on the first dielectric layer 12 and the second dielectric layer 18 to have a thickness about a range of between 4000–8000 angstroms. Any suitable material can be used to form the second dielectric layer 18 such as BPSG (borophosphosilicate glass).

Figure 7:
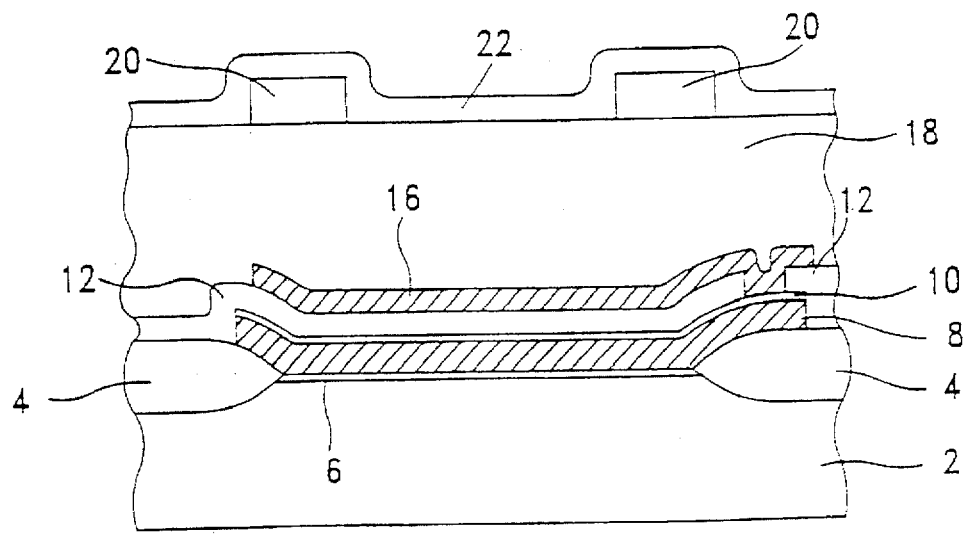
FIG. 7 is a cross section view of a semiconductor substrate illustrating the step of forming a metal layer and forming a third dielectric layer in accordance with the invention.

Referring to FIG. 7, a metal layer 20 is form on the BPSG layer 18. Any suitable material can be used to form the metal layer 20 such as tungsten or aluminum. Next, an etching process is utilized to etch the metal layer 20. A third dielectric layer 22 which is used as an isolation layer is formed on the metal layer 20. In preferred embodiment, the thickness of the third dielectric layer 22 layer is about 1000–4000 angstroms. The third dielectric layer 22 is composed of silicon dioxide or silicon nitride.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of fabricating a SRAM cell having a low stand-by current on a semiconductor substrate, said method comprising the steps of:

forming a silicon dioxide layer on said semiconductor substrate;

forming a first polysilicon layer on said silicon dioxide layer and on said substrate;

etching said silicon dioxide layer, said first polysilicon layer to form a gate structure;

forming a first dielectric layer on said gate structure and said substrate;

etching said first dielectric layer to form a contact window;

forming a second polysilicon layer on said first dielectric layer and along the surface of said contact window, said second polysilicon layer is exactly over said first polysilidon layer to reduce a stand-by current;

patterning a photoresist on said second polysilicon layer and etching said second polysilicon layer;

forming a second dielectric layer on said second polysilicon layer and over said substrate;

forming a metal layer on said second dielectric layer;

patterning a photoresist on said metal layer and etching said metal layer; and forming a third dielectric layer on said metal layer.

2. The method of claim 1, further comprising the step of forming a tungsten silicide layer on said first polysilicon layer before forming said gate structure.

3. The method of claim 1, wherein said first polysilicon layer is formed to have a thickness about 2000–4000 angstroms.

4. The method of claim 1, wherein said first dielectric layer is composed of silicon nitride.

5. The method of claim 4, wherein said first dielectric layer is formed to have a thickness about 500–2000 angstroms.

6. The method of claim 1, wherein said first dielectric layer is composed of silicon dioxide.

7. The method of claim 6, wherein said first dielectric layer is formed to have a thickness about 500–2000 angstroms.

8. The method of claim 1, wherein said second polysilicon layer is formed to have a thickness about 500–2000 angstroms.

9. The method of claim 1, wherein said second dielectric layer is composed of BPSG (borophosphosilicate glass).

10. The method of claim 9, wherein said second dielectric layer is formed to have a thickness about a range of between 4000–8000 angstroms.

11. The method of claim 1, wherein said third dielectric layer is composed of silicon dioxide.

12. The method of claim 11, wherein said third dielectric layer is formed to have a thickness about 1000–4000 angstroms.

13. The method of claim 1, wherein said third dielectric layer is composed of silicon nitride.

14. The method of claim 13, wherein said third dielectric layer is formed to have a thickness about 1000–4000 angstroms.

15. A method of fabricating a SRAM cell having a low stand-by current on semiconductor substrate, said method comprising the steps of:

forming a first silicon dioxide layer on said semiconductor substrate;

forming a first polysilicon layer on said first silicon dioxide layer and on said substrate;

etching said first silicon dioxide layer, said first polysilicon layer to form a gate structure;

forming a second silicon dioxide layer on said gate structure and said substrate;

etching said second silicon dioxide layer to form a contact window;

forming a second polysilicon layer on said second silicon dioxide layer and along the surface of said contact window, said second polysilicon layer is exactly over said first polysilicon layer to reduce a stand-by current;

patterning a photoresist on said second polysilicon layer and etching said second polysilicon layer;

forming a second BPSG layer on said second polysilicon layer and over said substrate;

forming a metal layer on said BPSG layer;

patterning a photoresist on said metal layer and etching said metal layer; and forming a third silicon dioxide layer on said metal layer.

16. The method of claim 15, wherein said first polysilicon layer is formed to have a thickness about 2000–4000 angstroms.

17. The method of claim 16, wherein said second silicon dioxide layer is formed to have a thickness about 500–2000 angstroms.

18. The method of claim 15, wherein said second polysilicon layer is formed to have a thickness about 500–2000 angstroms.

19. The method of claim 15, wherein said BPSG layer is formed to have a thickness about a range of between 4000–8000 angstroms.

20. The method of claim 15, wherein said third silicon dioxide layer is formed to have a thickness about 1000–4000 angstroms.

21. The method of claim 15, wherein said second silicon dioxide and said third silicon dioxide layer can be replaced by silicon nitride.

* * * * *